(12) United States Patent
Mikkonen et al.

(10) Patent No.: US 6,614,405 B1
(45) Date of Patent: Sep. 2, 2003

(54) FRAME STRUCTURE

(75) Inventors: Esa Mikkonen, Oulu (FI); Kalevi Pesonen, Oulu (FI); Kari Lohtander, Oulunsalo (FI)

(73) Assignee: Filtronic LK OY, Kempele (FI)

( * ) Notice: Subject to any disclaimer, the term of this patent is extended or adjusted under 35 U.S.C. 154(b) by 0 days.

(21) Appl. No.: 09/579,095

(22) Filed: May 25, 2000

Related U.S. Application Data (63) Continuation of application No. PCT/FI98/00927, filed on Nov. 25, 1998.

(30) Foreign Application Priority Data

Nov. 25, 1997 (FI) ................................................ 974315

(51) Int. Cl.[7] .............................. H01Q 1/42; H01Q 1/24
(52) U.S. Cl. .................................... 343/872; 343/702
(58) Field of Search ......................... 343/702, 700 MS, 343/841, 846, 872; 455/90, 128; 361/829; H01Q 1/24, 1/42

(56) References Cited

U.S. PATENT DOCUMENTS

| 3,879,682 | A | * | 4/1975 | Swartz et al. ................. 331/96 |
| 4,803,491 | A | * | 2/1989 | Hikuma ...................... 343/702 |
| 5,585,806 | A | * | 12/1996 | Ogino et al. ......... 343/700 MS |
| 5,691,732 | A | * | 11/1997 | Tsuru et al. ................. 343/745 |
| 5,802,458 | A | * | 9/1998 | Van Zeijl et al. .............. 455/90 |
| 6,014,113 | A | * | 1/2000 | Orchard et al. .............. 343/841 |
| 6,031,494 | A | * | 2/2000 | Okabe et al. ................ 343/702 |

FOREIGN PATENT DOCUMENTS

| DE | 42 15 041 A1 | 11/1992 | ............ H05K/7/14 |
| DE | 195 29 671 A1 | 2/1996 | ............ H05K/7/14 |
| DE | 9186473 | 11/1997 | ............ H05K/7/14 |
| GB | 2 006 535 A | 5/1978 | ............ H05K/7/14 |

* cited by examiner

*Primary Examiner*—Don Wong
*Assistant Examiner*—Trinh Vo Dinh
(74) *Attorney, Agent, or Firm*—Darby & Darby

(57) ABSTRACT

The invention relates to frame structures, particularly to mobile stations and other small-sized portable devices operating at high frequencies. The frame structure according to the invention is formed by extrusion, whereby the fixing means required for fastening components are formed into it during the extrusion. Such fixing means are preferably pin-like projections which can be compressed to a rivet fixing the component. Such fixing means can also be strip-like fixing edges which are bent over the component edges. With such fixing means it is possible to form at the same time both a mechanical fixing and a good electrical contact between the component and the frame structure. During the extrusion it is also possible to fasten to the frame structure parts made of other materials, such as fixing means of other types or other components, such as antennas.

17 Claims, 9 Drawing Sheets

FRAME STRUCTURE

This is a continuation of International Application Serial No. PCT/F198/00927 filed Nov. 25, 1998, the entire disclosure of which is incorporated herein by reference.

OBJECT OF THE INVENTION

The object of the invention is a frame structure according to the preamble of claim 1. The invention relates to frame structures, particularly to mobile stations and other small-sized portable equipment operating at high frequencies.

BACKGROUND OF THE INVENTION

Mobile phones utilize frame structures, to which the printed circuit board of the phone is fixed, whereby the frame structure is generally manufactured by casting, typically die casting, by deep drawing, by bending a metal sheet, or from metal coated plastic. Usually the frame structure comprises partitions which separate the components or component groups mounted on the device's printed circuit board from each other, whereby the partitions also form an RF shield in order to reduce the power of the radio frequency radiation received or emitted by said component or component group. Typically the partitions also make the frame more rigid.

The purpose of the frame structure is typically to protect the internal components of the device and in addition to support the printed circuit board or boards and other components of the device, as well as to reduce any interfering radiation generated by device from spreading into the environment. A purpose of the frame is also to protect the device's components from external electromechanical interference sources or signals being coupled to the components.

Previously there are many known ways to fasten components, such as printed circuit boards or corresponding, to the frame structure. Threadings can be made in the frame structure, particularly it its partitions or in pins made separately in the frame structure, so that the fastening can be made with screws. As the frame structures are often made very thin in order to minimize the weight of the device the partitions must often be equipped with bulges around the threadings so that there will be sufficiently material around the threads in order to achieve a firm fastening. One such solution is presented in the application publication EP-391 020, which presents a mobile phone frame structure. In the solution presented by the publication partitions are formed in connection with the frame structure so that the partitions have thickened places in partition corners and ends which enable fastening with screw. In a solution of this kind the components are fixed to the frame with the aid of screws, which complicates the manufacture of the frame structure and the assembly of the equipment. First the frame must be cast, after which the required threadings must be formed in different places of the structure. In the assembly phase the printed circuit board must be positioned accurately, so that the fastening holes in the printed circuit board are accurately registered with the threadings, and then the screws must be individually screwed. All this will result in a large number of work steps, which causes substantial costs in mass production.

The use of screws to fasten printed circuit boards and other components means that their corresponding threads require extra space in the frame structure and a corresponding space also on the printed circuit board which shall be fastened at that place, so that a component fastened on the printed circuit board will not be clamped between the printed circuit board and the fixing point. Thus a screw fastening consumes a substantial area on the printed circuit board.

In the mass production of mobile stations and corresponding devices it is essential that there is a minimum number of work steps and that they can be performed as fast as possible. Further, a maximally efficient use of the printed circuit board area is of primary importance in small-sized devices. Such devices must also be as light as possible, whereby it is an object to manufacture the components of the device of materials which are as thin and light as possible, but in spite of this the resulting device must be as rigid as possible and withstand blows, wear and torsion. Frame structures have been made for instance of plastics, on the surface of which a thin metal film is formed in order to obtain electrical protection characteristics. Plastic is a light material, but a problem is the low rigidity of plastic structures. In such cases the rigidity can be increased with the aid of partitions, but then the size of the device must be increased due to the space required by such extra reinforcing structures.

Magnesium has also been used as material for frame structures. Advantages of the magnesium is its lightness, the rigidity of structures made of it, and a possibility to realize versatile forms. Disadvantages of the magnesium are on the other hand a low resistance against corrosion and the high costs, and the threading bores also cause strength problems. Further a frame made of magnesium must be coated, which causes an extra work step. The coating also impairs the electrical characteristics of the magnesium frame, because the coating causes losses.

SHORT DESCRIPTION OF THE INVENTION

The object of the present invention is to eliminate the above mentioned disadvantages. An object of the invention is also a simple, cheap and durable structure. A further object of the invention is to realize a frame structure which is suitable to be used in mobile stations and other corresponding devices utilizing high frequencies, in which the frames must have a robust and rigid structure which acts as an efficient barrier against electromagnetic radiation and to which the device's components can be fixed in a simple, easy and reliable manner.

The objects of the invention are attained by forming the frame structure by extrusion, and by forming the fixing means required for fastening the components during the extrusion. Such fixing means are preferably pin-like projections, which can be compressed into a rivet fixing the component. Such fixing means can also be strip-like clamping edges which are bent over the edges of the component. With the aid of fixing means of this type it is at the same time possible to form both a mechanical fixing and a good electrical contact between the component and the frame structure. During the extrusion it is also possible to fix parts made of other materials to the frame structure, such as fixing means of different types and other components, such as antennas.

The frame structure according to the invention is characterized in what is said in the characterizing clause of the independent claim concerning the frame structure. The invention also relates to a device, which is characterized in what is said in the characterizing clause of the independent claim concerning the device. Further the invention relates to a method, which is characterized in what is said in the characterizing clause of the independent claim concerning the method. The dependent claims represent other preferred embodiments of the invention.

According to a preferred embodiment of the invention a rivet fixing can act as the fixing mechanism which replaces the screw fastening. Then the rivets are extruded in connection with the partitions belonging to the structure, whereby the rivets are made as projections directed upwards from the partitions and having a thickness, which can be the same as that of the partition. In connection with the fixing of the printed circuit board the free area of the compartments separated by the partitions is not reduced due to the fixing means, and the area of the printed circuit board can be utilized more effectively for components, compared to the conventional use of screws. A separate work step to enable the fixing, for instance threading, is avoided because the fixing means are formed already during the extrusion. The use of rivets integrated in the frame also facilitates the assembly phase, because there is no need to mount separate fastening means. Compressing a rivet is also a rapid step compared to the turning of a screw. One of the means formed during the extrusion can also be left so short that it is not thicker than the printed circuit board, whereby this means acts only as an registering means. The rivets can at the same time act as contact means on the printed circuit board, whereby the rivets form an electrical contact between the frame structure and the component to be fixed. Further, the rivet fixing can be applied to fix several different materials. With the aid of the rivet solution according to the invention it is possible to fasten both hard materials, such as metals, and soft materials, such as plastics. Riveting is well suited for extruded materials, because they are readily treated, so that the extrusion material is almost always a suitable material for rivets.

Preferably the fixing means can be integral with the frame structure material, whereby the extruded piece is formed from a single blank. The fixing means can also be a separate part, which is fixed to the structure during the extrusion. Such a piece fixed during the extrusion can be for instance a rivet blank or a threaded pin, which can be used as a fixing means. Also other required components, such as antennas, connectors or carrying strap holders and corresponding components can be fixed during the extrusion.

A separate part fixed during the extrusion can advantageously be used for instance when a certain location requires material characteristics which differ from the rest of the frame structure. The fixed part can differ from the extruded material for instance regarding wear resistance, conductivity or hardness, whereby two materials with different characteristics can be reliably combined when the separate part is fixed to the structure during the extrusion. The fastening of the separate part will also require no extra space, because the part is substantially fastened to the interior of the frame structure wall. The fastening method of the invention provides a strong joint and a fast fixing.

Another possibility to form a fixing means during the extrusion is to make strips or clamping edges at the edge of the frame structure, whereby these strips or edges are bent for instance by rolling or pressing them in some other way over the edge of the component to be fixed. Then a rolled edge clamps the fixed component firmly against the frame's edge. The fixing means can extend over the whole edge or be shorter than the edge, whereby there may be one or more such means on the same edge. By making the fixing means according to the invention on the opposite edges of the frame a firm fixing is obtained, which at the same time stiffens the whole structure. When a printed circuit board is clamped to the frame by rolling the printed circuit board also acts as a supporting structure for the whole structure. At the same time it is possible to achieve a good electrical contact between the frame and the clamped component.

In different embodiments of the invention the above mentioned fastening methods can be freely combined in the same structure. For instance, the fixing of a component to be fastened can in the central part be made by riveting and the edges can be clamped by rolling. Such a structure forms an extremely rigid, reliable and advantageous fixing solution for fixing a component.

In addition to fixing printed circuit boards the fixing means according to the invention can be used to fix also other components, such as antennas, display and keyboard units, large-sized separate components and hybrid modules. During extrusion the extruded material is forced to glide through a tool, or along the tool, so that it will be formed according to the extrusion profile of the tool. Extrusion methods are divided in two classes: direct extrusion and indirect extrusion. In direct extrusion the product glides in the direction of the pusher. Direct extrusion is used primarily to produce long profile bars. In indirect extrusion the product glides against the pusher direction forming e.g. a body with a bowl shape. For instance aluminum, copper, brass, zinc, lead and also some steel grades are used as raw materials. However, the most common and most used material is aluminum and its alloys. The extrusion can be performed either as hot extrusion or as cold extrusion, where, however, the blanks are heated to a soft state before extrusion in order to increase the shaping characteristics.

The design of different devices can be essentially simplified with the aid of the frame structure according to the invention, because with the aid of the extrusion method it is possible to make a wide diversity of different protecting and fixing means in one manufacturing step. In one manufacturing step it is possible to obtain, not only the desired form of the extruded product, but also the fixing means required to fix the components which shall be fastened to the structure. At the same time it is possible to form a structure divided into compartments, whose partitions make the structure more rigid. At the same time it is possible to make any required registering pins in the casing structure in order to facilitate the assembly. All this is achieved by a suitable tool selection, whereby it is easy to make different forms both rapidly and reliably only by changing tools. The material can be selected according to the application. It is for instance possible to make of aluminum and its alloys different structures which are optimized regarding corrosion durability. Of metals, for instance the above mentioned aluminum or aluminum alloys, it is also possible to make tight structures which act as RF shields.

BRIEF DESCRIPTION OF THE DRAWINGS

The invention is described below with the aid of some embodiment examples and with reference to the enclosed figures, in which.

The same reference numerals and markings are used for corresponding parts in the figures.

DESCRIPTION OF SOME PREFERRED EMBODIMENTS OF THE INVENTION

Figure 1:
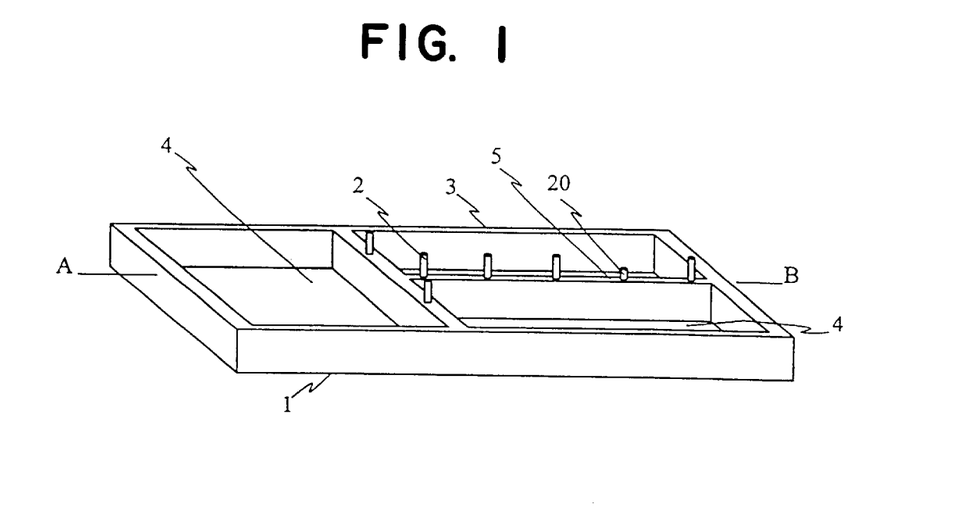
FIG. 1 shows an extruded casing structure according to an embodiment of the invention.

FIG. 1 presents an extruded frame structure according to a preferred embodiment of the invention, whereby projections 2 and registering pins 20 are formed in the structure during extrusion for the fixing of a printed circuit board or some other component and for creating an electrical connection between the component and the frame structure. The internal volume of the frame is divided into sections 4 by the partitions 5. The frame structure also comprises side walls 3. A cross section along the line A–B is shown in FIG. 2.

Figure 2:
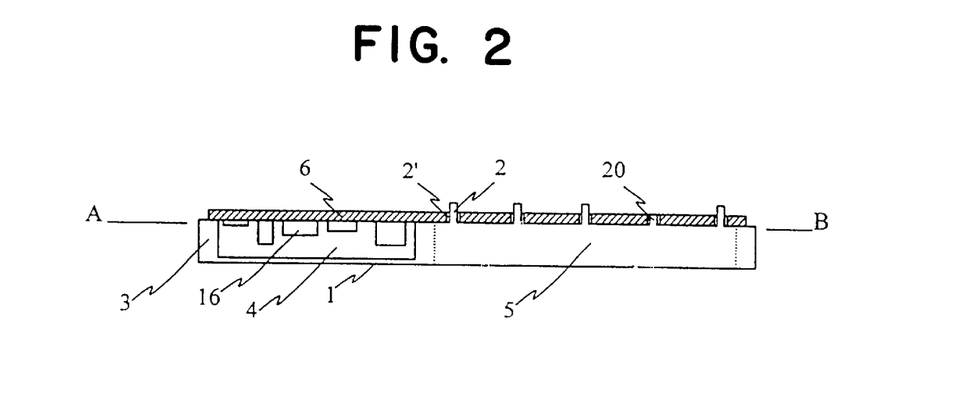
FIG. 2 shows a section of the structure of FIG. 1 in which is mounted a fixed component.
Figure 3A:
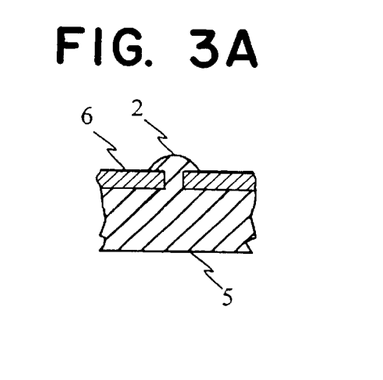
FIGS. 3A–3F show examples of different rivet models used in the casing structures according to the invention.
Figure 3B:
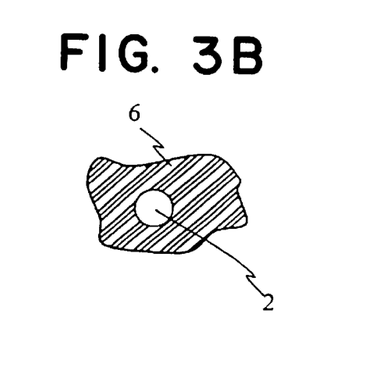
Figure 3C:
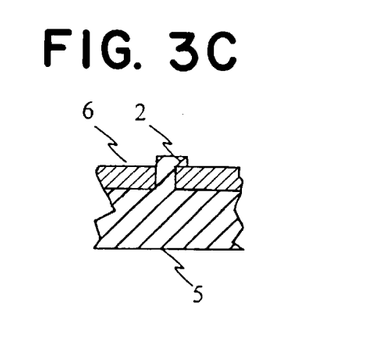
Figure 3D:
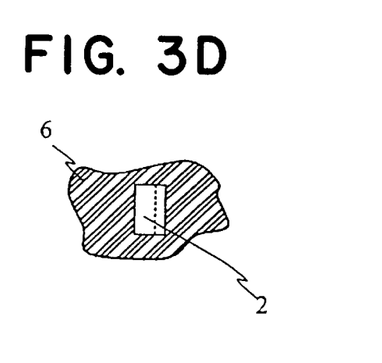
Figure 3E:
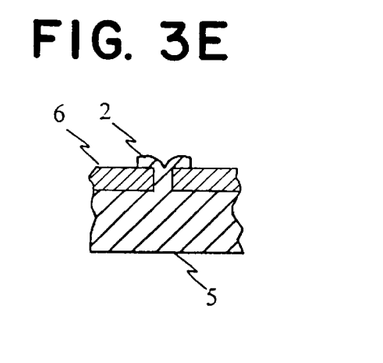
Figure 3F:
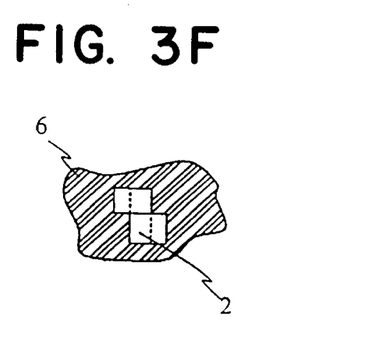

FIG. 2 shows a section of the frame structure according to the embodiment in FIG. 1, along the line A–B. FIG. 2 shows also a first component 6, here for instance a printed circuit board, which is placed in the frame structure 1. The printed circuit board 6 has holes 2' at points which correspond to the projections 2. In this embodiment such projections 2 act as rivets, which by compression can fix the printed circuit board 6 to the frame structure 1 and form an electrical connection between the frame structure and the printed circuit board. FIG. 2 also shows a support 20, and such supports can be used to support the printed circuit board or the component 6 in the manner shown in FIG. 2. The supports 20 can be used also as registering pins 20 aiding the registering of the printed circuit board to the correct fixing position, particularly when the printed circuit board must be exactly in a desired position. Then the printed circuit board or component 6 can have a recess or a hole which accurately corresponds to the form of the support 20, whereby the support 20 directs the printed circuit board or component 6 into the correct location and position. The supports and/or registering pins 20 can be used particularly advantageously also in such embodiments where no projections 2 registering into the holes 2' are used for the fixing of the component 6, whereby the projections 2 do not aid in the positioning of the component into the correct position. In FIG. 2 there are also second components 16 fixed to the printed circuit board 6 within the RF shielded space 4 between the printed circuit board and the frame structure. In various embodiments of the invention, there may be zero, one or more partitions 5, which divide the space between the printed circuit board or other component 6 and the frame structure into parts, at least one of which is an RF shielded space.

FIG. 3 shows examples of different rivet forms which can be realized with the aid of the projections 2. The top row of FIG. 3 shows a cross section of each rivet form and the bottom row shows the corresponding rivet form seen from the side of the component 6. In the rivet form A the rivet is formed by pressing with a concave tool, whereby the rivet head will become round. The form B is formed by bending the end of the projection 2 to one side. The form C again is formed by pressing different parts of the end of the projection to different sides. Note that the rivet shapes in FIG. 3 are only examples of some rivet forms which can be realized by extrusion, and the invention is not limited to the use of only these rivet forms.

The rivet forms of FIG. 3 also illustrate different possible exemplary forms of the projections 2. A projection can be for instance a cylinder according to the rivet form A, or a rectangular prism according to the rivet forms B and C. The invention is not limited to any particular form of the projection 2, but the projections 2 can be formed in many different ways according to the requirements of the embodiment in question.

Figure 4A:
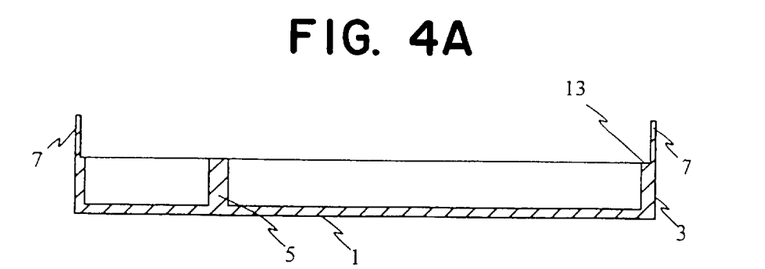
FIGS. 4A–4C show a manner according to a preferred embodiment of the invention to fix components with the aid of particular clamping edges.
Figure 4B:
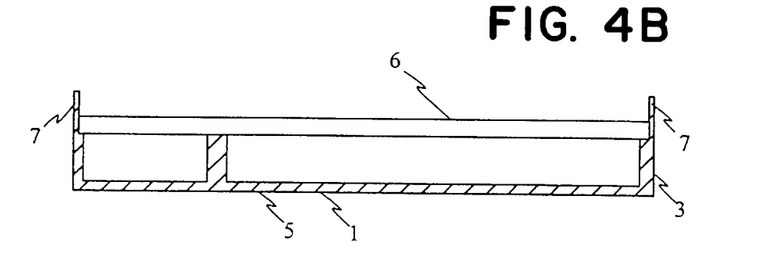
Figure 4C:
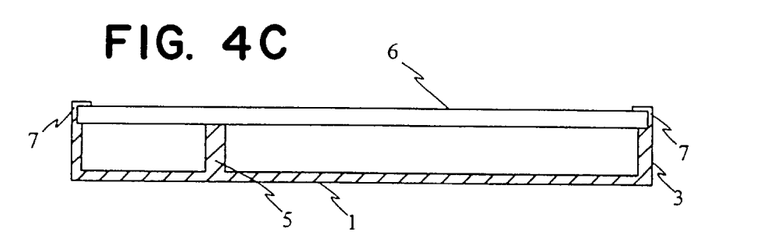

FIG. 4 shows an example of another preferred embodiment of the invention. In this embodiment plate-like projections or clamping edges 7 are used as fixing means, whereby the clamping edges are bent over the edges of the component to be mounted. FIG. 4 illustrates a series of actions in order to fix the component to the frame structure. In step 1 there is shown a frame element 1 which has clamping edges 7. The component 6 is placed in the frame element in the manner shown in step II, and then the clamping edges 7 are bent over the edges of the component 6 in the manner shown in step III. The clamping edges 7 can be bent over the edges of the component 6 for instance by rolling or by pressing at one or more different positions, or in any other known manner. The wall 3 of the frame has preferably also a step 13, against which the fixed component is pressed. At the same time the bent edge 7 and/or the step 13 can form an electrically conducting connection from the frame 1 to the component 6. In this way the ground plane of the printed circuit board can be connected to the frame structure 1 in order to form an RF shield which is as tight as possible. With the aid of such clamping edges a large-sized component 6, such as a printed circuit board 6, can also act as a stiffener of the frame structure 1, which enables the walls of the frame structure to be made thinner and thus to make an even more lighter device as the final product.

Advantageously the clamping edges 7 can be as long as the edges of the fixed component 6, whereby a particularly robust fixing can be made. However, the clamping edges can also be shorter strips, of which there may be one or more on different sides of the component 6. The use of shorter strips is advantageous for instance when the fixed component 6 has an arcuate edge.

Figure 5:
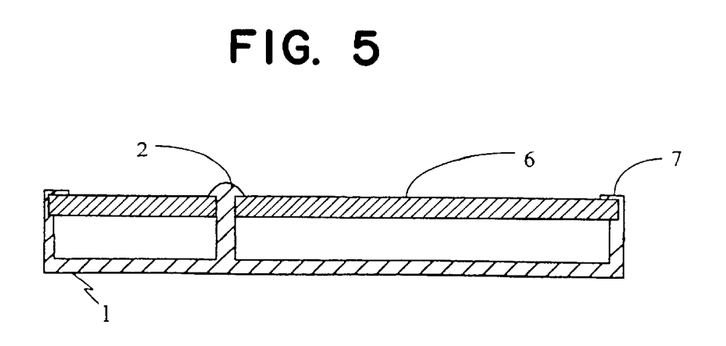
FIG. 5 shows a manner according to a preferred embodiment of the invention to fix components with the aid of both clamping edges and rivets.

FIG. 5 shows a combined structure of the above described fixing mechanisms according to a preferred embodiment of the invention which for clamping the printed circuit board 6 utilizes both a rivet formed by the projection and rolling or bending of the edges 7 over the printed circuit board edges. Then the printed circuit board is firmly fixed in its middle parts by the rivets 2, and further the whole structure is reinforced and the edges of the printed circuit board are supported by the rolled edge 7. The figure shows as an example only one rivet, but the number of rivets can be freely selected according the desired fixing points.

Figure 6:
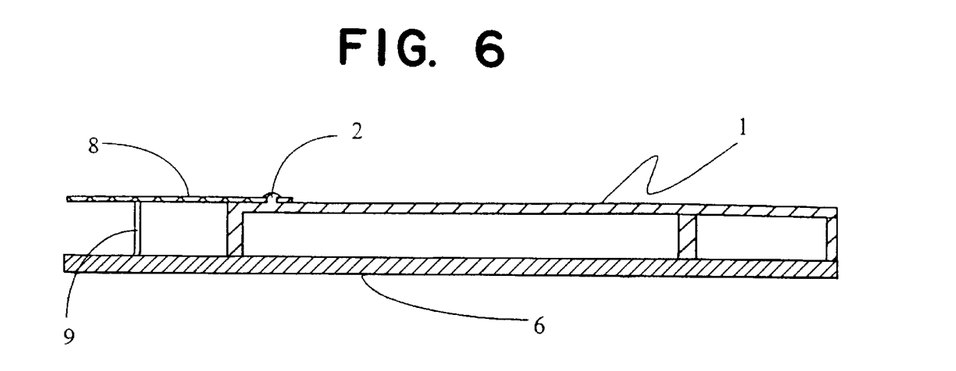
FIG. 6 shows a manner according to a preferred embodiment of the invention to fix an antenna element with the aid of a rivet fixing.

FIG. 6 shows another fixing application according to the invention where more than one component is fixed with fixing means according to the invention to the same frame structure. In the example of the embodiment in FIG. 6 rivet fixing is used to fasten the antenna element 8 to the frame structure 1. The printed circuit board 6 is fixed to the frame structure 1 either by any of the above presented means or in some other technique, such as with a screw fastening. During the extrusion of the frame structure 1 there is formed one or more projections 2, with which the antenna element 8 is fixed to the frame 1. FIG. 6 shows as an example the PIFA antenna structure (Planar Inverted F-antenna), which is intended to be located within the outer cover of a mobile communication means, whereby the antenna is not visible to the outside. The antenna comprises a radiating element 8 and an antenna feed pin 9, which is connected to the conductor pattern of the printed circuit board 6. In this solution the ground plane is formed on the printed circuit board 6, and the antenna element is short circuited to the ground plane through the frame structure 1.

Figure 7:
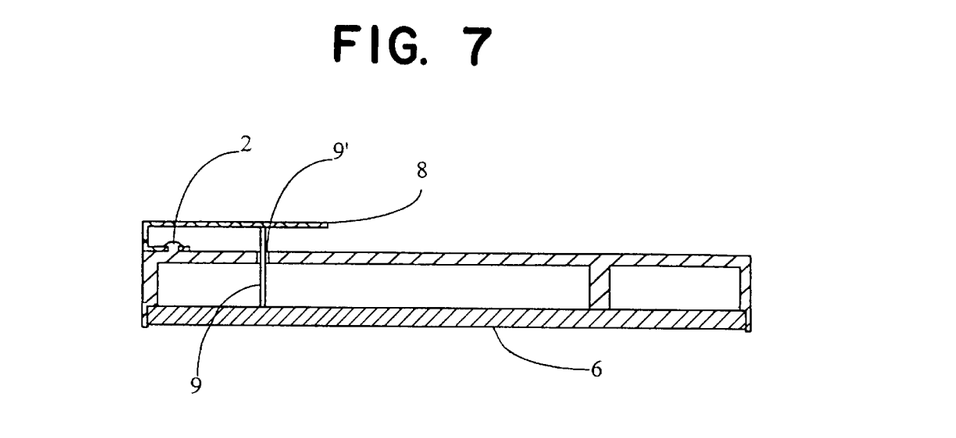
FIG. 7 shows a manner according to a second preferred embodiment of the invention to fix an antenna element with the aid of a rivet fixing.

FIG. 7 shows a method to fasten an antenna element according to a preferred embodiment of the invention. In this solution the frame structure acts as the ground plane. The antenna element is fastened to the cover structure 1 at the opposite side of the cover structure compared to the printed circuit board 6. The antenna element is connected to the printed circuit board 6 by the feed pin 9. The frame structure has a hole 9' at the position of the feed pin.

Figure 8:
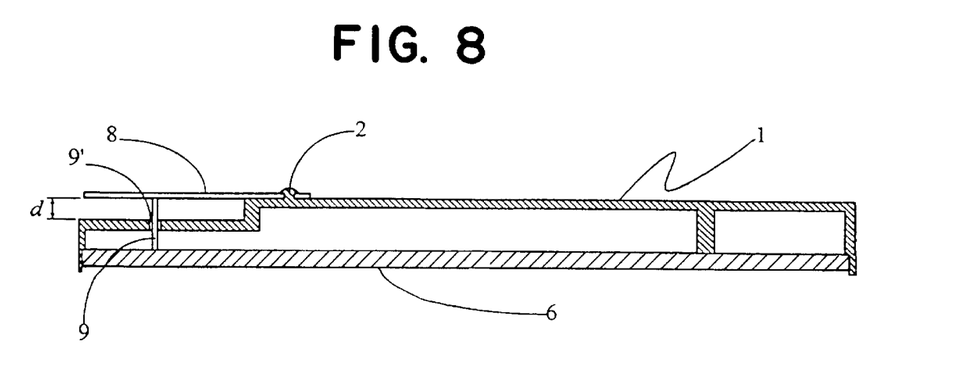
FIG. 8 shows a manner according to a third preferred embodiment of the invention to fix an antenna element with the aid of a rivet fixing.

FIG. 8 shows a method to fasten the antenna element 8 according to another preferred embodiment of the invention. In this solution the frame structure acts as the ground plane. At the position of the antenna the frame structure has a recess or step of a size which is about the same as that of the antenna and has a depth d which forms the distance of the antenna element from the ground plane. Due to the structure according to FIG. 8 the antenna element 8 forms a very low projection of the cover structure. The antenna element is connected to the printed circuit board 6 by a feed pin 9. The frame structure has a hole 9' at the position of the feed pin 9.

Figure 9A:
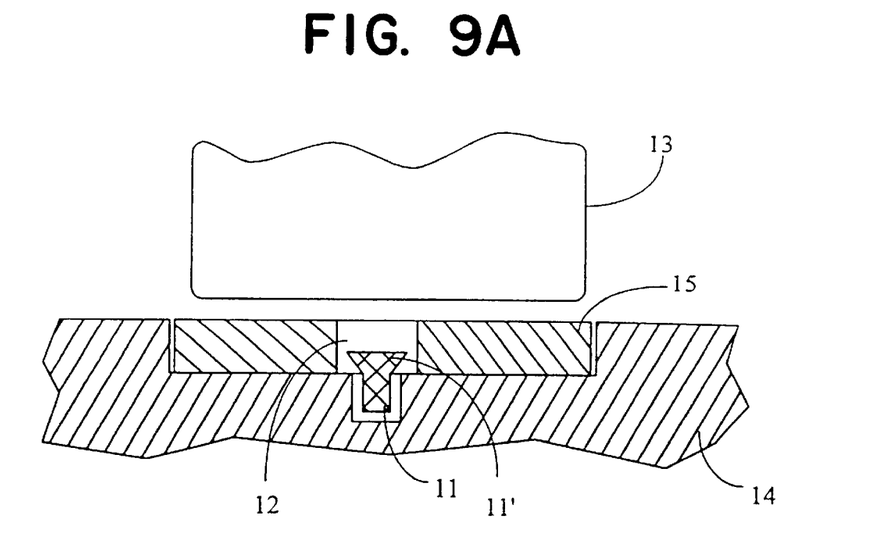
FIG. 9A–9B shows a manner according to a preferred embodiment of the invention to fix components during extrusion.
Figure 9B:
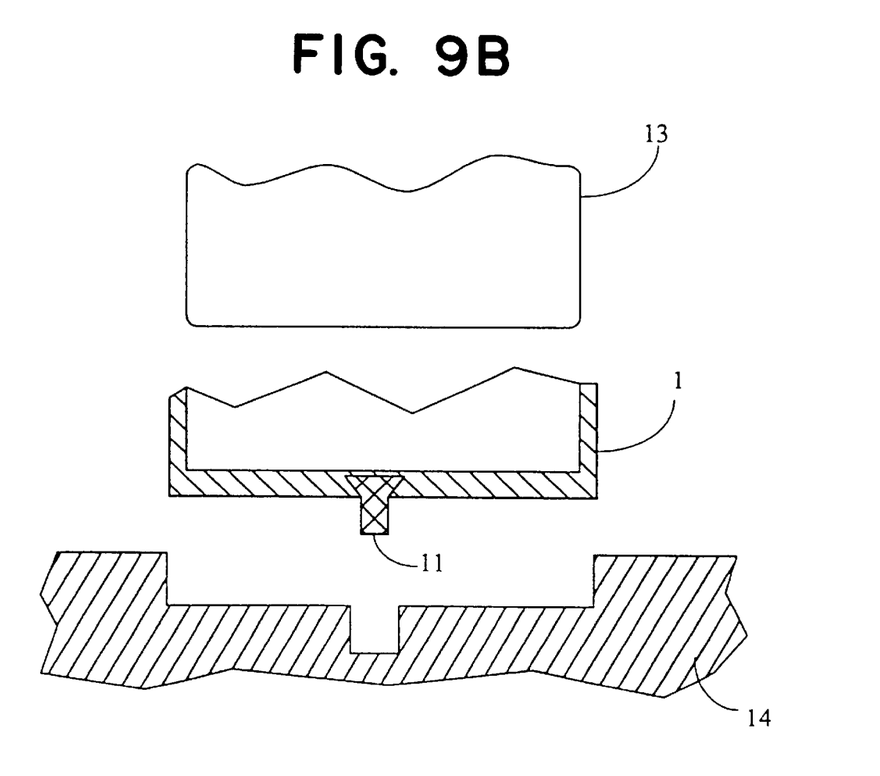

According to a preferred embodiment of the invention a separate piece can be mounted in the frame structure during the extrusion. FIG. 9 shows an embodiment according to the invention for mounting a piece 11 in the frame during the extrusion. The extrusion blank 15 has a recess or opening 12 for the separate piece 11, and the blank and the piece 11 to be fixed to the frame structure are placed between the extrusion mandrel 13 and the forming pad 14 before the extrusion. This step is in FIG. 9 shown as step I. During the extrusion the blank 15 is formed so that it encloses a part of the piece 11 to be fixed to the frame structure, and at the same time it fixes it firmly to the proper structure in the manner shown in step II of FIG. 9. The fixed piece can have a gripping part 11', as in the case of the figure, which is made in a form which ensures that the piece is firmly held in the extruded structure. FIG. 9 shows how a pin-like piece, for instance a screw or any other fastening means is fixed to the frame structure during extrusion, but the fixed part can also have other forms. One application is for instance the fixing of an antenna to the frame of a mobile phone with this method, whereby for instance an antenna can be directly fixed to the frame according to the FIG. 6, 7 or 8, and no separate riveting is required.

Figure 10:
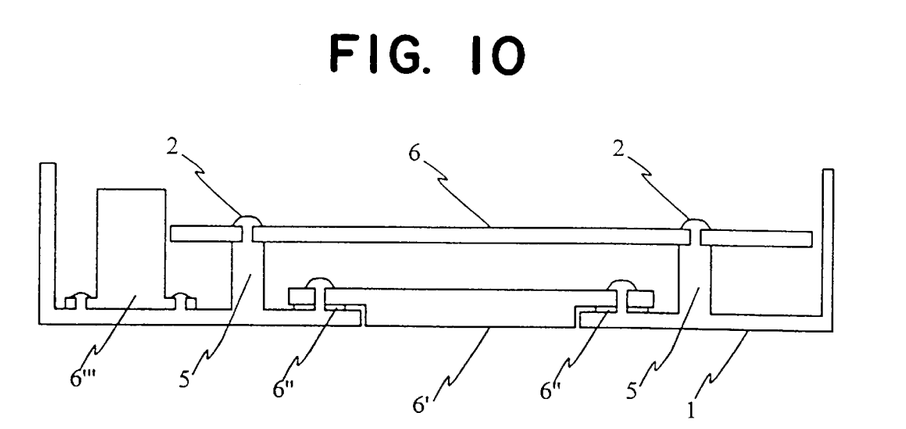
FIG. 10 shows a manner according to a preferred embodiment of the invention to fix more than one component to a casing structure according to the invention.

FIG. 10 shows such a preferred embodiment of the invention where more than one component 6, 6', 6" on top of each other is fixed to the frame structure 1. With the method according to the invention it is possible to fasten for instance the device's printed circuit board 6, the keyboard or display unit 6' and a seal 6". The components 6, 6', 6" are preferably fastened in a suitable order, if the upper components do not have openings for pressing the fixing projections 2 of the lower components. The partitions 5 or platforms 5 define the mounting height of the components 6, 6', 6". The components can also be in more than two layers. For instance in such an embodiment of the invention where the frame structure according to the invention is used as a frame structure of a high frequency device, such as a mobile station, it is advantageous to add to the structure like that of FIG. 10 for instance a metal plate as an RF shield between the keyboard unit 6' and the printed circuit board 6, so that the high frequency signals will not leak outside the device from the printed circuit board 6 through the opening of the keyboard unit. With the method according to the invention it also possible to fasten to the cover structure components of another type than the planar components, which in FIG. 10 are exemplified by a large-sized single component or module 6'".

Figure 11:
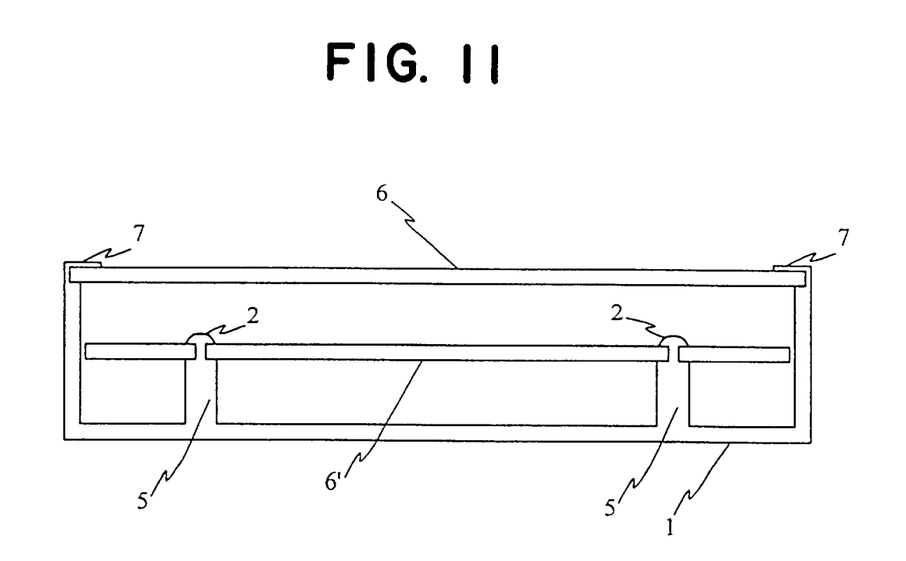
FIG. 11 shows manner according to a preferred embodiment of the invention to fix more than one component to a casing structure according to the invention.

FIG. 11 illustrates such a preferred embodiment of the invention where fixing with the aid of both projections 2 and clamping edges 7 are utilized in the same device. In this example the bottom component 6', for instance a printed circuit board 6', is fixed with the aid of projections 2, and the top component 6, for instance a metal plate 6, is fixed with the aid of bent or rolled clamping edges 7'.

Figure 12:
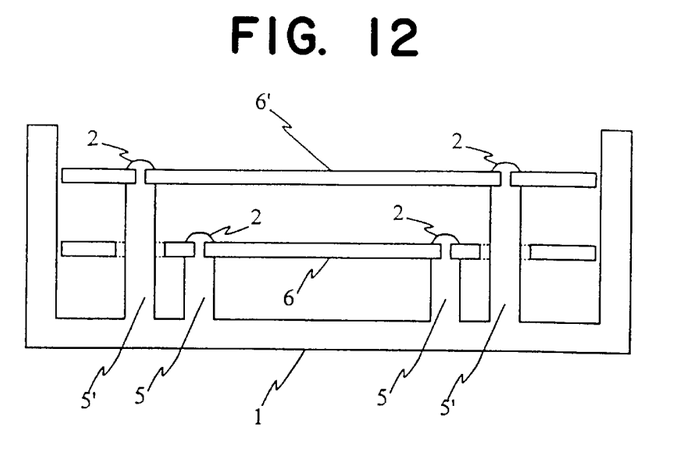
FIG. 12 shows a manner according to a preferred embodiment of the invention to fix more than one component on top of each other with the aid of rivet fixing.
Figure 13A:
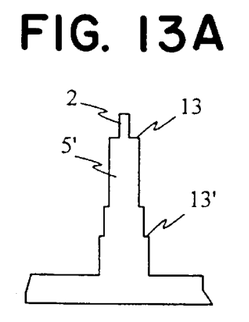
FIGS. 13A–13E illustrate a manner according to a preferred embodiment of the invention to fix more than one component on top of each other.
Figure 13B:
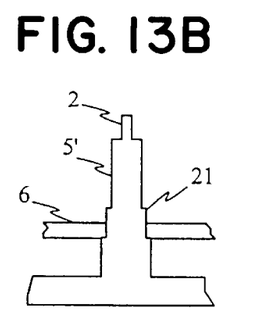
Figure 13C:
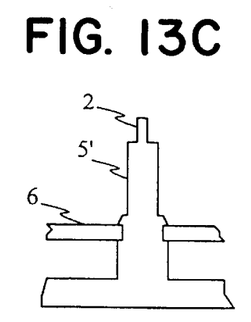
Figure 13D:
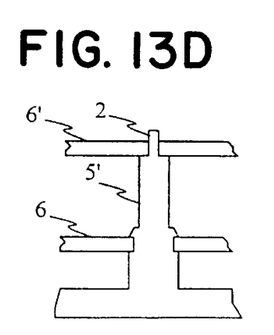
Figure 13E:
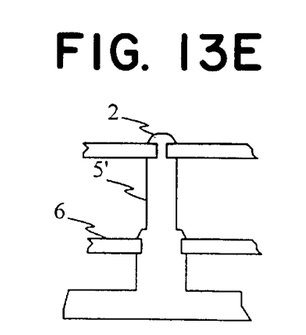

FIG. 12 illustrates another method according to the invention to fix more than one component on top of each other. In the embodiment of FIG. 12 this is realized with the aid of partitions 5 or narrow platforms 5' having different heights. The bottom component 6 can be fixed with the aid of projections 2 formed in the partitions 5. In this embodiment the top components are fixed with the aid of the platforms 5'. The bottom component 6 can have an opening for the platform 5'. The edge of the component 6 can also have a recess for the platform 5', if the platform 5' is close to the edge of the component. At the ends of the platforms 5' there are projections 2, with the aid of which the top component 6' is fixed into its position.

FIG. 13 illustrates a preferred embodiment of the invention where the same platform 5' is used for the fixing of more than one component 6, 6'. In the step 1 of FIG. 13 the platform 5' is shown before mounting of the components. The platform 5' has one step 13, 13' for each component to be fixed. In step II a first component 6 is placed on the platform 5' on the lower step 13'. In step III the first component is fixed to the platform 5' by pressing platform material from the corner 21 over the edges of the fixing hole of the component 6. In step IV a second component 6' is placed on the platform 5', and in step V the second component is fixed to the platform with the aid of a rivet formed by the projection 2.

Further the FIGS. 14 to 20 show some antenna structures which are suitable to be used in the above presented frame structures. These antenna structures are integral with the frame structure, and most preferably they are formed during the manufacturing of the frame structure, substantially in the same manner as the other details of the frame structure, as for instance the projections 2. In the embodiments shown in FIGS. 14 to 20 the material of the frame structure is most preferably metal, such as aluminum or an aluminum alloy. In these embodiments the material of the frame structure can also be a dielectric, such as a plastic, if the frame structure is coated by an electrically conducting layer, such as a metal layer, at least over the area of the radiator.

Figure 14:
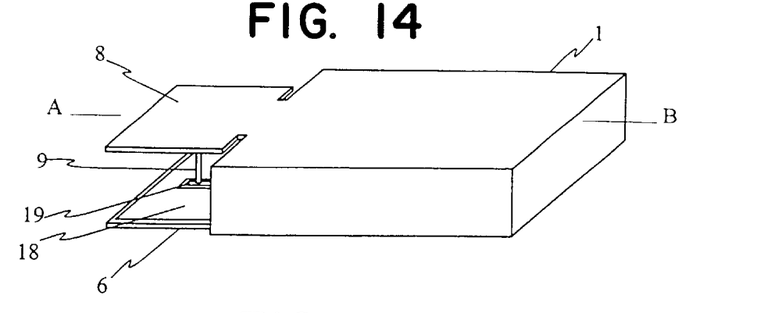
FIG. 14 shows an antenna and casing structure according to a preferred embodiment of the invention.

FIG. 14 shows an antenna and frame structure according to a preferred embodiment of the invention. The figure shows the frame 1, the antenna radiator 8 and the printed circuit board 6, of a mobile station or another device utilizing high frequency radio communication. The frame structure 1 and the radiator 8 form a single integrated component. A ground plane 18 is formed on the printed circuit board 6 with the aid of an electrically conducting pattern. The feed line 9 connects the radio frequency signals from the feeding conductor 19 to the antenna radiator 8. In this embodiment the feed line 9 can preferably be realized as a projection of the integral component formed by the radiator and the frame structure. The feed line can also be realized in other ways, for instance by a conductor soldered between a separate printed circuit board and the radiator. The cross section of the structure along the line A–B is shown in FIG. 15.

Figure 15:
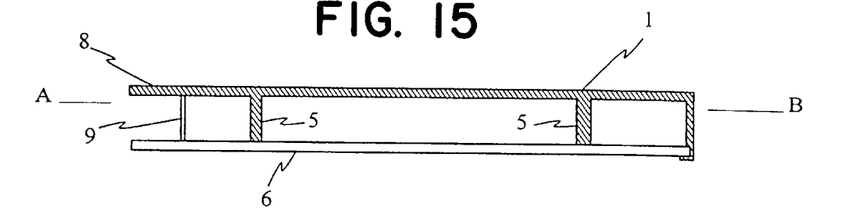
FIG. 15 shows a cross section of the structure in FIG. 14.

FIG. 15 illustrates the structure of the embodiment in FIG. 14, particularly the cross section of the structure along the line A–B. The figure shows the device's printed circuit board 6, the feed line 9 and the antenna radiator 8 and the frame structure 1, which form an integral body comprising partitions 5 supporting the printed circuit board 6. In this embodiment the feed line 9 can be realized as a part of the integral body forming the radiator and the frame structure.

Figure 16:
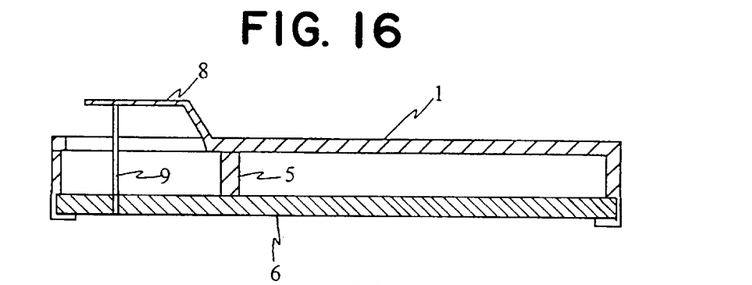
FIG. 16 shows a cross section of a casing structure according to a preferred embodiment of the invention.

FIG. 16 illustrates a preferred embodiment of the invention. In this embodiment the radiator 8 of the antenna structure is in a different plane than the frame structure 1, slightly outside the frame structure. A radiator of this type can be formed in the frame structure 1 for instance after the manufacture by cutting in the frame structure a slit corresponding to the edges of the radiator, and bending the radiator outside the frame structure. However, the invention is not restricted to an embodiment of this type, but the structure formed by the radiator 8 and the frame structure 1 in FIG. 16 can also be manufactured in one step, for instance by casting. The figure also shows the printed circuit board 6 of the device, the feed line 9 and the partition 5 supporting the printed circuit board 6.

Figure 17:
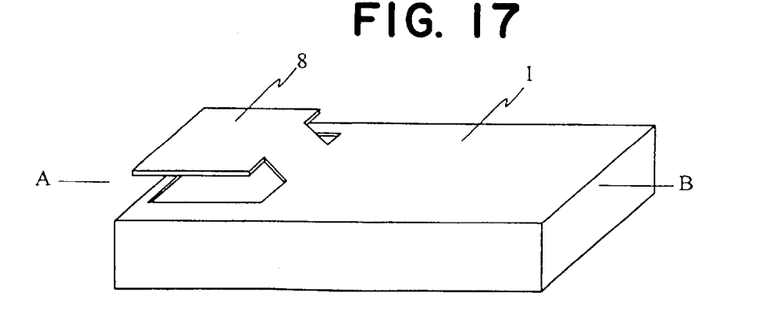
FIG. 17 illustrates the embodiment of FIG. 16.

FIG. 17 is a perspective view illustrating the embodiment of FIG. 16. The figure shows the frame structure 1 and the radiator 8 forming a projection of it. The cross section shown in FIG. 16 represents the line A–B in FIG. 17.

Figure 18:
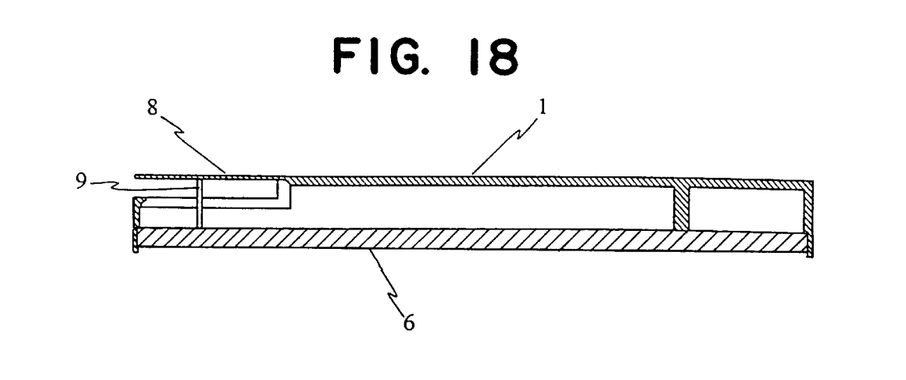
FIG. 18 shows a cross section of a casing structure according to a preferred embodiment of the invention.

FIG. 18 illustrates a preferred embodiment of the invention. In this embodiment the radiator 8 is substantially in the same plane as the side of the frame structure 1. The frame structure 1 has a recess at the position of the radiator 8. In this embodiment the ground plane is preferably formed on the printed circuit board 6. The figure also shows the feed line 9 and a partition 5 supporting the printed circuit board 6.

Figure 19:
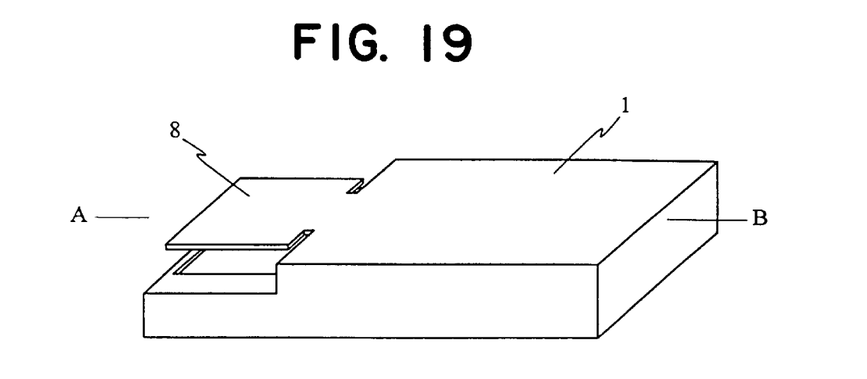
FIG. 19 illustrates the embodiment of FIG. 18.

FIG. 19 is a perspective view illustrating the embodiment of FIG. 18. The figure shows the frame structure and the radiator 8 forming a projection of the frame structure. The cross section shown in FIG. 18 represents the line A–B in FIG. 19.

Figure 20:
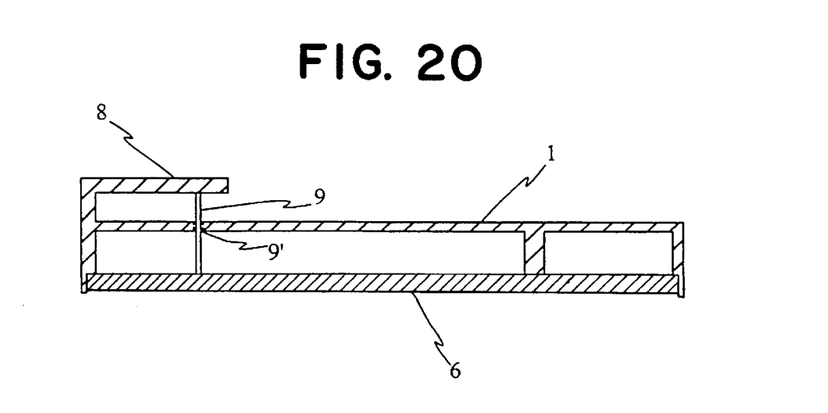
FIG. 20 shows a cross section of a casing structure according to a preferred embodiment of the invention.

FIG. 20 shows a cross section of a preferred embodiment of the invention. In this embodiment the side of the frame structure 1 acts as the ground plane of the antenna structure.

According to the desired material and the manufacturing techniques the radiator 8 can be bent for instance into the position shown in FIG. 20. The body formed by the frame structure and the radiator can also be cast directly into the form shown by FIG. 20. In this embodiment the frame structure includes a hole 9' for the feed line 9, whereby the feed line can be directed from the printed circuit board 6 to the radiator 8 through this hole.

The cover structure according to the invention is particularly well suited for cover structures of mobile stations. The antenna of the mobile station can be fastened for instance in the ways shown by FIG. 6, 7, 8 or 9, and the printed circuit boards, the display and keyboard units can be fixed for instance in the way shown in FIG. 10 or in any other way shown in this application. The antenna structure formed into the cover structures shown in FIGS. 14 to 20 are particularly well adapted to be realized in connection with mobile station frame structures.

The rivet fixing is firm, operates reliably and is easily realized. A rivet is also a durable connection, which does not loosen, which is possible when for instance using a screw fastening.

Above the invention was described with reference to a few of its preferred embodiments, but is obvious that the invention can be modified in many different ways according to the inventive idea defined by the enclosed claims. For instance, even if the component to be fastened is preferably flat, it is also possible to fix other types of components to the cover structure according to the invention, such as transformers provided with flat fixing legs. The component can also be of the same material as the frame structure, for instance in an embodiment where an aluminum plate for the RF shield is clamped to an aluminum frame structure with the aid of bendable clamping edges. An excellent mechanical and electrically tight connection is obtained with this fixing method. Any extrudable material according to the requirements of the particular application can be used as the cover structure material. If a nonconducting material is used as the cover structure material, a layer of conductive material needs to be applied to the cover structure in order to form an RF shield according to the invention. Also, the invention does not limit the use of conventional fastening methods, such as screw fastening, in the structures utilizing the invention.

What is claimed is:

1. A frame for an electronic device, comprising:
    an extruded frame structure having a generally planar base with particular dimensions and upstanding sides extending from the base, said frame structure supporting substantially all elements of the device;
    at least one extruded fixing means for fastening a planar component of the electronic device to the frame structure by shaping of said fixing means, the planar dimensions of the component being smaller than the planar dimensions of the base, said fixing means having been extruded in one piece with said frame structure during the same extrusion process that formed the frame structure, and axes of said fixing means being essentially perpendicular to the base and extending from the upstanding sides of the frame structure; and wherein also an electrical contact between the frame structure and said component is provided by shaping said fixing means.

2. The frame structure according to claim 1, wherein said fixing means is a clamping edge and said shaping is bending of said clamping edge.

3. The frame structure according to claim 1, wherein said fixing means is a projection and said shaping is flattening the end of said projection.

4. The frame structure according to claim 1, wherein at least one component is fastened to the frame structure during the extrusion.

5. The frame structure according to claim 1, further comprising an antenna radiator having been formed in one piece with the frame structure.

6. A device comprising:
   an extruded frame structure having a generally planar base with particular dimensions and upstanding sides extending from the base, said frame structure supporting substantially all elements of the device;
   at least one extruded fixing means for fasting a planar component of the device to the frame structure by shaping of said fixing means, the planar dimensions of the component being smaller than the planar dimensions of the base, said fixing means having been extruded in one piece with said frame structure during the same extrusion process that formed the frame structure, and
   axes of said fixing means being essentially perpendicular to the base and extending from the upstanding sides of said frame structure, and wherein also an electrical contact between the frame structure and said component is provided by shaping said fixing means.

7. The device according to claim 6 comprising second components in addition to said at least one first component, wherein at least one second component is between the frame structure and said at least one first component, and the frame structure and said at least one first component form a RF shield for at least one second component.

8. The device according to claim 6, wherein at least one of said at least one first component is a printed circuit board.

9. The device according to claim 8, wherein said frame structure comprises at least one partition, which divides a space between the frame structure and the printed circuit board into at least two parts, at least one of which is an RF shielded space.

10. The device according to claim 6, wherein at least one first component is an antenna.

11. The device according to claim 6, wherein the device is a mobile communication means.

12. The device according to claim 6, said frame structure comprises a radiator which is formed during the extrusion and which forms an integral body with the frame structure.

13. A method to manufacture an electronic device, comprising the steps of,
   (a) extruding a frame structure of the device and extruding a fixing means in said frame structure in the same extrusion step and as one piece,
   (b) fixing a component to the frame structure by said fixing means;
   (c) substantially supporting all elements of the device on said frame structure;
   (d) dimensioning said frame structure whereby the planar dimensions of said components are smaller than the planar dimensions of said frame structure; and
   (e) forming an electrical contact between said component and the frame structure by shaping said fixing means.

14. The method according to claim 13, wherein said fixing means is a clamping edge, whereby the method comprises a step in which at least one component is fixed to the frame structure by bending said clamping edge.

15. The method according to claim 13, wherein said fixing means is a projection, whereby the method comprises a step in which at least one component is fixed to the frame structure by shaping the end of said projection.

16. The method according to claim 13, wherein said component is fixed in such a way at least partly in-order to form an RF shield for components between said component and the frame structure.

17. The method according to claim 13, wherein said component is fixed in such a way at least partly in order to stiffen the combined structure.

* * * * *